United States Patent [19]

Dimigen

[11] 3,839,177

[45] Oct. 1, 1974

[54] METHOD OF MANUFACTURING ETCHED PATTERNS IN THIN LAYERS HAVING DEFINED EDGE PROFILES

[75] Inventor: Heinz Dimigen, Hamburg, Germany

[73] Assignee: U.S. Philips Corporation, New York, N.Y.

[22] Filed: Apr. 5, 1972

[21] Appl. No.: 241,243

[30] Foreign Application Priority Data

Apr. 8, 1971 Germany ............................ 2117199

[52] U.S. Cl. ................................................ 204/192
[51] Int. Cl. ........................................... C23c 15/00
[58] Field of Search ...................................... 204/192

[56] References Cited

UNITED STATES PATENTS

| | | | |
|---|---|---|---|
| 3,410,774 | 11/1968 | Barson et al. | 204/192 |
| 3,474,021 | 10/1969 | Davidse et al. | 204/192 |
| 3,479,269 | 11/1969 | Byrnes et al. | 204/192 |
| 3,585,121 | 6/1971 | Franks et al. | 204/192 |
| 3,676,317 | 7/1972 | Harkins | 204/192 |
| 3,733,258 | 5/1973 | Hanak et al. | 204/192 |

*Primary Examiner*—John H. Mack
*Assistant Examiner*—D. R. Valentine
*Attorney, Agent, or Firm*—Frank R. Trifari; Norman N. Spain

[57] ABSTRACT

For the manufacture of etched patterns in thin layers having defined edge profiles varying within wide limits, an etching mask of, e.g., photolacquer having a defined edge profile is formed on the material to be etched, after which both the etching mask consisting of photolacquer and the material to be etched not covered by the etching mask are removed by direct voltage or high-frequency "sputter"-etching. The desirable profile of the etching mask consisting of photolacquer can be controlled by a thermal treatment at a temperature associated with the profile to be formed.

6 Claims, 8 Drawing Figures

Figure 1:
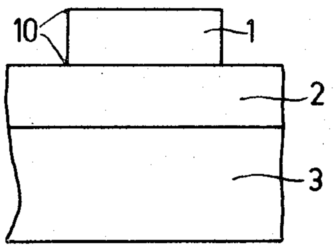

METHOD OF MANUFACTURING ETCHED PATTERNS IN THIN LAYERS HAVING DEFINED EDGE PROFILES

The invention relates to a method of manufacturing etched patterns in thin layers having defined edge profiles varying within wide limits by means of a "sputter"-etching process.

In thin-layer technology, for example, in manufacturing solid-state circuits, it is required to etch desired patterns in thin layers by means of suitable methods. In this case, and in particular in manufacturing integrated circuits having wiring consisting of several layers, it is desirable for the etched thin layers to obtain defined edge profiles.

It is known (see French Pat. No. 1,508,463 and a first addition to said French Pat. No. 93,425) to use an etching mask which, as usual, consists of a layer of photolacquer in which the desirable pattern is provided by means of a photolithographic method, the parts of the layer to be etched not covered by said layer of photolacquer being etched away by means of a "sputter"-etching process, i.e., by means of an ion bombardment.

According to this known method, only patterns having steep edges can be formed in the layer to be etched. This is unfavourable, when a thin magnetic layer is provided on the etched layer, because the magnetic properties thereof strongly depend upon the edge profile.

Also in the case of the above-mentioned wiring consisting of several layers it is desirable that the edges of the etched layer do not extend steeply but show a desirable defined profile, for example an inclination of 45°, because upon providing further layers on the etched layer, a provided further layer has too small a thickness at the area of too steep edges.

It is the object of the invention to provide a method of the type mentioned in the preamble with which it is possible to manufacture etched layers with defined edge profiles.

According to the invention this is achieved in that an etching mask is used having defined edge profiles and the etching mask and the material to be etched are removed at etching rates of substantially the same order of magnitude.

So the invention is based on the recognition of the fact that defined edge profiles in etched layers can be obtained by means of a "sputter"-etching process by giving the etching mask the desirable defined edge profile and then removing the etching mask and the layer to be etched at etching rates of substantially the same order of magnitude so that the edge profile of the etching mask is formed in the etched layer.

In the method according to the invention, the etching rates for the etching mask and for the layer to be etched and the thicknesses of the etching mask and of the layer to be etched can be chosen to be so that the etching mask and the parts of the layer to be etched not covered by said mask have been removed entirely simultaneously, that the etching mask has been removed entirely before the layer to be etched or that the parts of the layer to be etched not covered by the etching mask have been removed entirely before the etching mask.

According to a further embodiment of the invention, a layer of photolacquer is used as an etching mask to which, after the pattern to be formed in the layer to be etched has been provided therein by means of the conventional photolithographic method, the desirable, defined edge profile can easily be given at the temperature associated with the desirable profile.

The etching rates for the etching mask and for the layer to be etched can be controlled by the addition of one or more reactive gases to an inert working gas used in the "sputter"-etching process.

When a layer of photolacquer is used as an etching mask, and when the etching rate for said mask must be considerably lower than the etching rate for the layer to be etched, according to a further embodiment of the invention, a "sputter"-etching device is used having a target of a material which binds the gases liberated in the working space as strongly as possible. Such a target may consist of titanium or zirconium.

The advantages obtained according to the invention consist in particular in that patterns having defined edge profiles can easily be manufactured and in a reproducible manner in thin layers, in which it is necessary only to give the desirable edge profile to the etching mask, which profile is then formed in the layer to be etched by means of the "sputter"-etching process.

Figure 1A:
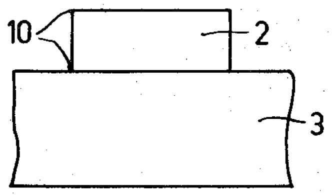
Figure 2:
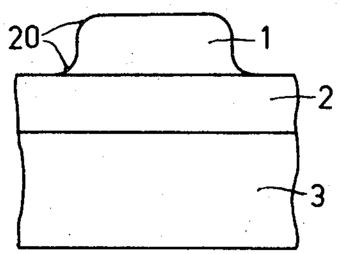
Figure 2A:
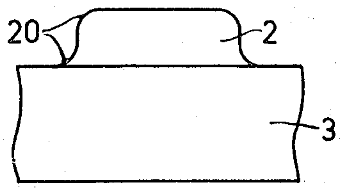
Figure 3:
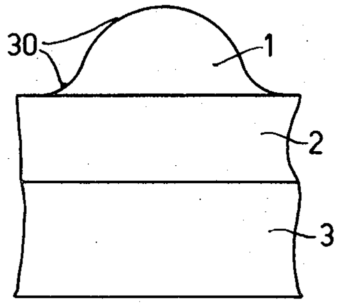
Figure 3A:
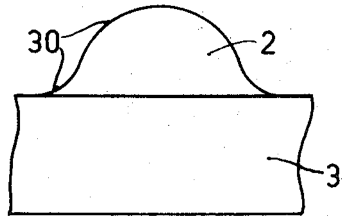
Figure 3B:
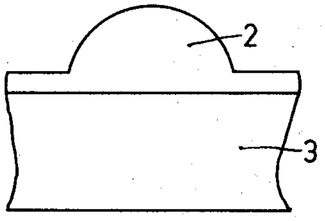
Figure 3C:
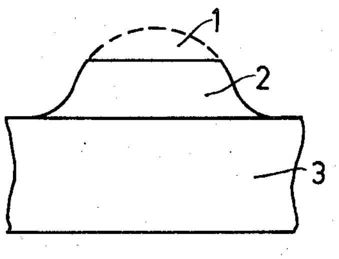

In order that the invention may be readily carried into effect, it will now be described in greater detail, by way of example, with reference to the accompanying drawings, in which:

FIG. 1 shows a succession of layers of photolacquer, the material to be etched, and the supporting material, FIG. 1*a* shows an etched profile according to FIG. 1, FIG. 2 shows a succession of layers shown in FIG. 1 in which, however, the photolacquer has been subjected to a thermal treatment at a temperature of approximately 120°C, FIG. 2*a* shows an etched profile according to FIG. 2, FIG. 3 shows a succession of layers according to FIG. 1 in which, however, the photolacquer has been subjected to a thermal treatment at a temperature of approximately 250°C, FIG. 3*a* shows an etched profile according to FIG. 3, FIG. 3*b* shows an etched profile according to FIG. 3 in which the etching rate for the photolacquer is larger than the etching rate for the material to be etched, and FIG. 3*c* shows an etched profile according to FIG. 3, in which the etching rate for the photolacquer is lower than the etching rate for the material to be etched.

FIGS. 1 and 1a show a first embodiment of the invention, FIG. 1 shows a succession of layers consisting of an etching mask 1 of photolacquer forming the desirable pattern, a thin $SiO_2$-layer 2 to be etched and a supporting layer 3. The material marketed under the name of "Shipley AZ 1350 H" was used as a photolacquer. The etching mask 1 and the thin layer 2 to be etched have the same thicknesses of approximately 1 $\mu$m.

The parts of the layer 2 to be etched not covered by the etching mask 1 are removed by high frequency "sputter"-etching, that is to say by etching with ions. This is carried out in a suitable, argon ions-producing cathode sputtering device, preferably at a pressure of $10^{-2}$ Torr. The energy of the argon ion source is approximately 5 W/sq.cm. The etching mask 1 and the parts of the $SiO_2$-layer 2 not covered by said mask are removed by the ion beam in a period of time of approximately 15 minutes at approximately the same rate.

After termination of the "sputter"-process the structure of layers shown in FIG. 1*a* is obtained, which means that the etching mask has been removed entirely, while the layer to be etched has been removed down to the supporting layer 3 in the places which have not been covered by the etching mask. During this etching process, in which the etching mask and the material to be etched had the same thicknesses, and were removed at approximately the same rate, the edge profile 10 of the etching mask is formed in the remaining part of the $SiO_2$-layer 2.

In the first above-described embodiment, the edge profile was a simple vertical transition. When the resulting edge profile should extend differently, the etching mask should show said edge profile prior to the beginning of the etching process. In the embodiment shown in FIGS. 2 and 2*a*, this is achieved by slightly rounding the mask used in this case also and consisting of a photolacquer at its edge by means of a thermal treatment at a temperature of approximately 120°C, so that the edge profile 20 shown in FIG. 2 is obtained which otherwise corresponds in general to FIG. 1.

When said structure of layers is subjected under the same conditions, that is to say with the same layer thickness and the same etching rates, to the "sputter"-etching process described with reference to the first embodiment, the edge profile of the etching mask is formed in the remaining part 2 of the $SiO_2$-layer in this case also, which layer thus obtains the desirable edge profile.

When it is desirable to have an even more rounded edge profile which has, for example, a slope of 45°, as is shown in the third embodiment shown in FIGS. 3 and 3*a*, which also correspond in general to FIGS. 1 and 1*a* and 2 and 2*a*, respectively, the etching mask 1 consisting of photolacquer is subjected to a thermal treatment at a higher temperature of approximately 250°C. The edge profile which is considerably rounded and is denoted in FIG. 3 by 30 is formed which has a flat angle of inclination. FIG. 3*a* shows the corresponding edge profile of the etched $SiO_2$-layer 2. In this embodiment also it was assumed that the thicknesses of the etching mask and of the layer to be etched are the same and that the mask and the layer are removed at approximately the same rate.

It is possible, however, to obtain a large number of different edge profiles in the etched layer by choosing for the etching mask a thickness differing from that of the layer to be etched and/or by choosing different etching rates for the etching mask and the layer to be etched. According to the invention, the etching rates for the etching mask and for the layer to be etched, respectively, may be up to 50 times larger than for the layer to be etched and the etching mask, respectively.

When in the case of a structure of layers shown in FIG. 3 a higher etching rate is chosen for the etching mask 1 than for the layer 2 to be etched, the etching mask, with otherwise the same thicknesses of the two layers, has already been removed entirely when the parts of the layer to be etched not covered by the etching mask have not yet been removed entirely, that is to say, that the layer 2 to be etched obtains the variation shown in FIG. 3*b*.

When on the contrary the etching rate for the layer to be etched is chosen to be higher than the etching rate for the etching mask, again starting from the structure of layers shown in FIG. 3, the variation of the layer to be etched shown in FIG. 3*c* is obtained after etching. Since the parts of the layer to be etched not covered have already been removed before the etching mask, a remaining part of the etching mask 1 remains which is then to be removed by means of any of the conventional methods.

An edge profile associated with the two latter embodiments can also be obtained by choosing different thicknesses for the etching mask and for the layer to be etched with the same (or different) etching rates for the etching mask and for the layer to be etched.

The ratio between the etching rates for the etching mask and the layer to be etched can be controlled by the addition of one or more reactive gases to the inert working gas used in the cathode sputtering device. In this case it is efficacious to supervise and possibly control the partial pressure of the reactive gas(es) by means of a mass spectrometer.

It is desirable to keep the etching rate for an etching mask consisting of photolacquer as low as possible, without reducing the etching rate for the layer to be etched, which layer preferably consists of $SiO_2$; it is efficacious to use in the cathode sputtering device a target of a material which binds the reactive gases present in the working space as strongly as possible.

Such materials are titanium and zirconium.

What is claimed is:

1. A method of manufacturing etched patterns in thin layers having desired edge profiles comprising applying to a substrate a layer of a substance to be etched, applying to the portions of said layer desired to be protected from etching an etching mask having the desired edge profile, said etching mask being formed on said layer by depositing a layer of photolacquer thereon, developing said photolacquer layer and heating said developed photolacquer layer at a temperature sufficient to form an etching mask having the desired edge profiles and then removing the etching mask and the unprotected portions of said thin layer by sputter etching at substantially the same rates.

2. A method of claim 1, wherein a sputter-etching device having a target is used which consists of a material which strongly binds to it any reactive gas present in the working space.

3. A method as claimed in claim 1, characterized in that the etching rates for the etching mask and for the layer to be etched as well as the thicknesses of the etching mask and of the layer to be etched are chosen to be so that the etching mask and the parts of the layer to be etched not covered by said mask are removed entirely simultaneously.

4. A method as claimed in claim 1, characterized in that the etching rates for the etching mask and for the layer to be etched, as well as the thicknesses of the etching mask and of the layer to be etched are chosen to be so that the etching mask has been removed entirely before the layer to be etched.

5. A method as claimed in claim 1, characterized in that the etching rates for the etching mask and for the layer to be etched, as well as the thicknesses of the etching mask and of the layer to be etched are chosen to be so that the parts of the layer to be etched not covered by the etching mask have been removed entirely before the etching mask.

6. A method as claimed in claim 2, characterized in that titanium or zirconium is used as a material for the target.

* * * * *